(12) United States Patent
Gelso et al.

(10) Patent No.: US 10,151,801 B2
(45) Date of Patent: Dec. 11, 2018

(54) METHOD AND SYSTEM FOR MONITORING THE STATUS OF BATTERY CELLS

(71) Applicant: VOLVO TRUCK CORPORATION, Göteborg (SE)

(72) Inventors: Esteban Gelso, Göteborg (SE); Jonas Hellgren, Göteborg (SE)

(73) Assignee: Volvo Truck Corporation, Göteborg (SE)

( * ) Notice: Subject to any disclaimer, the term of this patent is extended or adjusted under 35 U.S.C. 154(b) by 0 days.

(21) Appl. No.: 15/307,726

(22) PCT Filed: Jun. 2, 2014

(86) PCT No.: PCT/EP2014/001477
§ 371 (c)(1),
(2) Date: Oct. 28, 2016

(87) PCT Pub. No.: WO2015/185070
PCT Pub. Date: Dec. 10, 2015

(65) Prior Publication Data
US 2017/0074945 A1    Mar. 16, 2017

(51) Int. Cl.
*G01R 31/36* (2006.01)
*B60L 11/18* (2006.01)
(Continued)

(52) U.S. Cl.
CPC ........ *G01R 31/3658* (2013.01); *B60L 3/0046* (2013.01); *B60L 11/1851* (2013.01);
(Continued)

(58) Field of Classification Search
CPC .................................................... G01N 27/416
(Continued)

(56) References Cited

U.S. PATENT DOCUMENTS 6,332,113 B1 * 12/2001 Bertness ............ G01R 31/3662
                                                              320/116
8,054,034 B2 * 11/2011 Lim ...................... H02J 7/0016
                                                              320/101
(Continued)

FOREIGN PATENT DOCUMENTS

EP     1308739 A2    5/2003
EP     2412581 A1    2/2012
FR     2 776 139 A1  9/1999

OTHER PUBLICATIONS

International Search Report (dated Oct. 8, 2014) for corresponding International App. PCT/EP2014/001477.
(Continued)

*Primary Examiner* — Patrick Assouad
*Assistant Examiner* — Sean Curtis
(74) *Attorney, Agent, or Firm* — WRB-IP LLP

(57) ABSTRACT

A method for monitoring the status of a plurality of connected battery cells in a battery pack includes: arranging the battery cells in at least two groups of cells; connecting the groups of cells to a sensor unit; and providing a measurement of at least one parameter indicative of the state of operation of the battery pack by the sensor unit. The method further includes arranging the groups of cells in a manner so that at least two of the groups include two or more cells and at least two of the groups overlap so that a cell forms part of the overlapping groups; and connecting the sensor unit to the groups; and wherein the number of groups is less than the number of cells.

12 Claims, 3 Drawing Sheets

(51) Int. Cl.
*H01M 10/48* (2006.01)
*B60L 3/00* (2006.01)
*H01M 10/42* (2006.01)

(52) U.S. Cl.
CPC ....... *B60L 11/1857* (2013.01); *B60L 11/1861* (2013.01); *G01R 31/3662* (2013.01); *G01R 31/3679* (2013.01); *G01R 31/3682* (2013.01); *H01M 10/482* (2013.01); *H01M 10/486* (2013.01); *B60L 2240/545* (2013.01); *B60L 2240/547* (2013.01); *H01M 10/4207* (2013.01); *H01M 2010/4271* (2013.01); *H01M 2220/20* (2013.01); *Y02T 10/7005* (2013.01); *Y02T 10/705* (2013.01); *Y02T 10/7044* (2013.01)

(58) Field of Classification Search
USPC ........................................................ 324/426
See application file for complete search history.

(56) References Cited

U.S. PATENT DOCUMENTS

| | | | | |
|---|---|---|---|---|
| 8,956,751 B2* | 2/2015 | Noh | ............ | H01M 2/1077 429/99 |
| 2003/0146737 A1* | 8/2003 | Kadouchi | ............ | H02J 7/0019 320/132 |
| 2006/0019155 A1* | 1/2006 | Seman, Jr. | ............ | H01M 2/204 429/159 |
| 2007/0247115 A1* | 10/2007 | Ishikawa | ............ | H02J 7/0016 320/119 |
| 2010/0237830 A1* | 9/2010 | Castelaz | ............ | H02J 7/0019 320/118 |
| 2012/0139545 A1* | 6/2012 | Makihara | ............ | G01R 31/362 324/426 |
| 2012/0153961 A1* | 6/2012 | Kobayashi | ............ | G01R 31/362 324/434 |
| 2012/0194135 A1* | 8/2012 | Mizoguchi | ............ | G01R 31/3658 320/118 |
| 2012/0308848 A1* | 12/2012 | Miyamae | ............ | H01M 2/1077 429/7 |
| 2013/0257371 A1* | 10/2013 | Komai | ............ | H01M 10/44 320/108 |
| 2013/0288094 A1* | 10/2013 | Noh | ............ | H01M 2/1077 429/99 |
| 2014/0055896 A1* | 2/2014 | Muramoto | ............ | H02H 7/18 361/86 |
| 2014/0141301 A1* | 5/2014 | Aoki | ............ | H01M 10/482 429/90 |
| 2014/0199569 A1* | 7/2014 | Sisk | ............ | B60L 3/0046 429/91 |
| 2014/0302357 A1* | 10/2014 | Tsuruta | ............ | H01M 2/1077 429/53 |
| 2014/0354236 A1* | 12/2014 | Kim | ............ | H02J 7/0016 320/134 |
| 2017/0074945 A1* | 3/2017 | Gelso | ............ | B60L 11/1851 |
| 2018/0106869 A1* | 4/2018 | Gelso | ............ | G01R 31/3651 |
| 2018/0190960 A1* | 7/2018 | Harris | ............ | H01M 2/206 |

OTHER PUBLICATIONS

International Prelimninary Repoort on Patentability (dated May 18, 2016) for corresponding International App. PCT/EP2014/001477.
Amanda Davis et al: 11 Evaluation of Lithium-Ion Synergetic Battery Pack as Battery Charger11 IEEE Transactions on Energy Conversion. IEEE Service Center. Piscataway. NJ us. vol. 14. No. 3. Sep. 1, 1999 (Sep. 1, 1999). pp. 830-834. XP011084511. ISSN: 0885-8969.

* cited by examiner

METHOD AND SYSTEM FOR MONITORING THE STATUS OF BATTERY CELLS

BACKGROUND AND SUMMARY

The invention relates to a method for monitoring the status of a plurality of connected battery cells in a battery pack, said method comprising: arranging said battery cells in at least two groups of cells; connecting said groups of cells to a sensor unit; and providing a measurement of at least one parameter indicative of the state of operation of said battery pack by means of said sensor unit.

The invention also relates to a battery management system for monitoring the status of a plurality of connected battery cells in a battery pack, comprising: a plurality of battery cells which are arranged in at least two groups of cells; a sensor unit connected to said groups, said sensor unit being configured for providing a measurement of at least one parameter indicative of the state of operation of said battery pack; and a control unit connected to said sensor unit.

The invention can be applied in vehicles, such as cars, trucks, buses and construction equipment. Although the invention will be described with respect to an application in the form of a bus, the invention is not restricted to this particular type of vehicle, but may be used in other vehicles.

In the field of vehicles, there is a steady increase in research and development related to propulsion of vehicles with alternative power sources, i.e. power sources being used as alternatives to conventional internal combustion engines.

An internal combustion engine, for example in the form of a gasoline engine or a diesel engine, offers high efficiency with relatively low fuel consumption. However, environmental concerns have led to an increase in development of more environmental-friendly power sources for vehicles. In particular, it can be noted that electrically operated vehicles has emerged as a promising alternative.

Today, there exist various types of vehicle propulsion systems comprising electric machines. For example, a vehicle can be operated by means of an electric machine solely, or by means of an arrangement comprising both an electric machine and an internal combustion engine. The latter alternative is often referred to as a hybrid vehicle (HEV), and can for example be utilized in a manner in which an internal combustion engine is used for operating the vehicle while driving outside urban areas whereas the electric machine can be used in urban areas or in environments in which there is a need to limit, the discharge of harmful pollutants such as oxides of nitrogen, fossil carbon dioxide and carbon monoxide.

The technology involved in electrically operated vehicles is closely related to the development of electrical energy storage systems, such as battery-related technology for vehicles. Today's electrical energy storage systems for vehicles may comprise a battery pack with a plurality of rechargeable battery cells which, together with control circuits, form a system which is arranged in a vehicle and which is configured for providing electric power to an electric machine. A hybrid vehicle is also often arranged so that the energy storage system is charged during braking, by means of a process known as regenerative braking.

A vehicle which is operated by means of an internal combustion engine and an electric machine supplied with power from a rechargeable electrical energy storage system is sometimes referred to as a plug-in hybrid electric vehicle (PHEV). A plug-in hybrid electric vehicle normally uses an energy storage system with rechargeable battery cells which can be restored into a condition involving a full charge through a connection to an external electric power supply. The external power supply can be in the form of the common electric grid power system which can be accessed via a conventional power cord, or can be in the form of other arrangements depending on the vehicles involved and the power need for the recharging process.

During charging, a high amount of energy must be fed into the energy storage system in a relatively short time in order to optimize the vehicle's range of driving.

For this reason, the actual charging of the energy storage system is suitably implemented through a process in which a control unit on the vehicle requests a charging process to be carried out by means of an external electric power supply. This is carried out after the energy storage system and the external power supply have been electrically connected by means of suitable connector elements.

With reference to the field of automotive technology, an energy storage system normally comprises a battery pack with a large number of battery cells. Using a plug-in hybrid vehicle as an example, a battery pack may for example be of the lithium-ion type. In the event that a 600 V lithium-ion battery pack is used, approximately 200 battery cells connected in series will then be needed to achieve a desired voltage in order to operate the vehicle. The available range for driving the vehicle then depends on certain parameters such as the state of charge (SOC) of the battery pack. The state of charge is an important parameter to use in order to prevent batteries from being operated during under- or over-charging situations, and to manage the energy in electric vehicles. The state of charge needs to be estimated since no direct measurement is available for this parameter.

Furthermore, it is known that batteries degrade over time, and there is a need to diagnose the decrease in performance estimated by means of battery parameters that change during the lifetime of the battery, i.e. cell capacity and ohmic resistance. These parameters can be used for health monitoring, to estimate the so-called state of health (SOH) of the battery, and prognostics, to predict when it will fail or reach its end of life.

It is also known to use a battery management system in a vehicle in order to ensure safe operating conditions of the vehicle. In such a battery management system, monitoring each cell is desired but since a battery pack could include many cells, this task could be very time consuming and may put heavy demands on a control unit as regards the capacity for calculations. There is consequently a need for accurate monitoring of the battery cells of a battery pack. In particular, it is necessary to estimate parameters such as the state of charge (SOH) and the state of health (SOH) of a battery pack.

The U.S. Pat. No. 8,054,034 discloses a battery management system configured for monitoring and controlling a battery pack with a plurality of battery cells. The document discloses that the battery cells are arranged in a number of groups and that these groups are connected to a sensing unit which senses the voltages of the battery cells. These measurements are used for determining whether there is a need for a cell balancing process of the battery pack.

Although the system according to U.S. Pat. No. 8,054,034 is arranged for monitoring a battery pack in which a number of battery cells are configured in groups and monitored, there is a general problem with previous solutions in the sense that they are relatively complex and costly with regard to battery measurements and calculations.

Consequently, it is desirable to provide a method and an arrangement which solve the problems associated with prior solutions and by means of which the status of a battery pack can be monitored in an accurate and cost-efficient manner. It is desirable to provide a method and an arrangement by means of which the state of charge (SOC) and the state of health (SOH) of a battery pack can be estimated in a cost-efficient manner.

According to a first aspect of the invention, in a method for monitoring the status of a plurality of connected battery cells in a battery pack, said method comprising: arranging said battery cells in at least two groups of cells; connecting said groups of cells to a sensor unit; and providing a measurement of at least one parameter indicative of the state of operation of said battery pack by means of said sensor unit. The method further comprises: arranging said groups of cells in a manner so that at least two of said groups comprise two or more cells and at least two of said groups overlap so that a cell forms part of said overlapping groups; and connecting said sensor unit to said groups; and wherein the number of groups is less than the number of cells.

An advantage with the present invention is that it contributes to a decreased computational workload during said monitoring. A particular advantage is that the number of required sensors can be decreased as compared with known solutions, but without affecting the detectability and isolability properties needed for fault diagnosis of the battery pack. This means that the total cost for a battery pack including the required sensor units can be greatly reduced as compared with today's solutions.

According to one embodiment, the groups of cells are arranged in a manner so that it fulfills the relationship: number of groups−number of cells/2>1. An advantage with this embodiment is that it defines that the amount of sensors associated with a battery pack can be greatly reduced as compared with prior solutions.

According to one embodiment, the sensors are used for measuring at least one parameter related to the state of operation of said battery cells, said parameter being at least one of the following: the battery current; the terminal voltage of at least one cell; and the temperature of at least one cell. This means that measurements and fault diagnosis based on said parameters can be implemented in a cost-effective manner with reduced computer workload as compared with known solutions. Also, the invention offers a possibility of calculating a "remaining useful life" property of the battery pack, i.e. by using the capacity or resistance estimates.

Furthermore, according to one embodiment, the method comprises estimating, based on the measured parameter, at least one of the following properties of each battery cell or groups of cells: the state of charge; the cell capacity; and the resistance.

According to one embodiment, the method comprises generating an indication of a fault in the event that the result of said measurement deviates from an expected value. Consequently, the fault detection can be made according to the above-mentioned principles in order so solve the problems related to prior art.

According to a further embodiment of the invention, it relates to a battery management system for monitoring the status of a plurality of connected battery cells in a battery pack, comprising: a plurality of battery cells which are arranged in at least two groups of cells; a sensor unit connected to said groups, said sensor unit being configured for providing a measurement of at least one parameter indicative of the state of operation of said battery pack; and a control unit connected to said sensor unit. According to said embodiment, the system further comprises: an arrangement of said groups of cells wherein: at least two of said groups comprise two or more cells, and at least two of said groups overlap so that a cell forms part of said overlapping groups; and a connection between said sensor unit and said groups; wherein the number of groups is less than the number of cells.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

DETAILED DESCRIPTION

Figure 1:
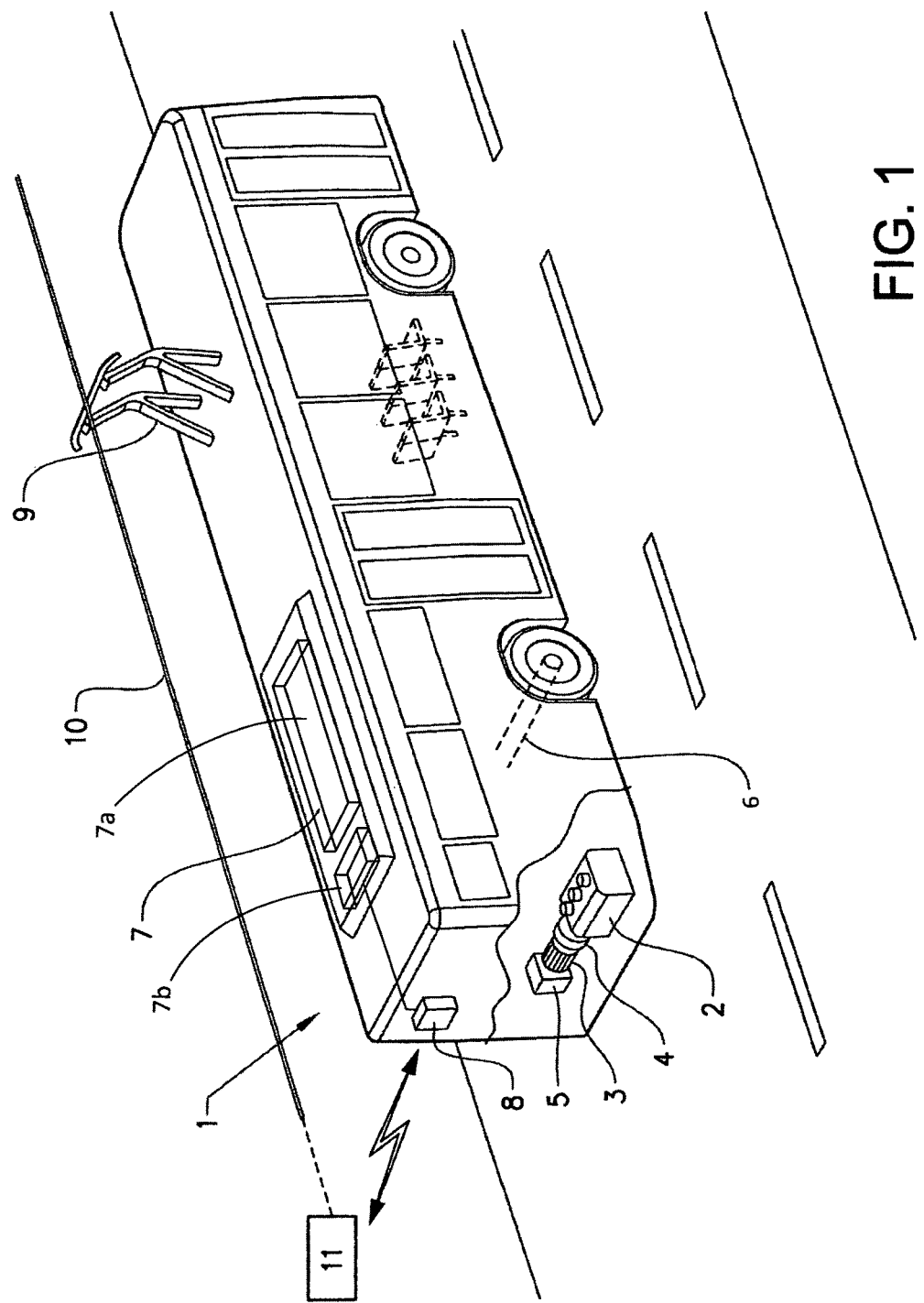
FIG. 1 shows a schematic view of a hybrid vehicle in the form of a bus, in which the present invention can be used.

The invention will now be described with reference to an embodiment and the enclosed drawings. With initial reference to FIG. 1, there is shown a simplified perspective view of a vehicle in the form of a bus 1 which according to the embodiment is of hybrid type. More precisely, the bus 1 is of the so-called plug-in hybrid type which is equipped with an internal combustion engine 2 and an electric machine 3 which are connected to each other via a clutch 4 and wherein both the internal combustion engine 2 and the electrical machine 2 can be used to drive the bus 1.

The electric machine 3 is connected to a gearbox 5, which in turn is connected to a rear axle 6 of the bus 1. In a manner which is known as such and is therefore not described in the internal combustion engine 2 and the electric machine 3 can be used for driving the rear axle 6. According to the embodiment, the electric machine 3 is used as a combined electric drive motor and generator, and is suitably also used as a starter motor for the internal combustion engine 2.

The bus 1 carries an electric energy storage system 7 which comprises a battery pack 7a which in turn comprises a plurality of battery cells (not shown in detail in FIG. 1). As will be described in greater detail below, the battery cells are connected in series to provide an output DC voltage having a desired voltage level, Suitably, the battery cells are of lithium-ion type, but other types may also be used.

The energy storage system 7 also comprises a sensor unit 7b which is arranged for measuring one or more predetermined parameters which are indicative of the state of operation of the battery pack 7a. For example, the sensor unit 7b can be configured for measuring the voltage of the battery pack 7a and its battery cells. Furthermore, the sensor unit 7b can be configured for measuring an alternative parameter such as the battery current or the temperature of each battery cell.

Such parameters can be used for controlling the condition of the battery pack 7a. The energy storage system 7 also comprises control circuits adapted for monitoring the operation of the battery cells. The battery pack 7a will be described in greater detail below with reference to FIGS. 2 and 3.

According to the embodiment, the energy storage system 7 is arranged on the roof of the bus 1, as indicated in FIG.

1. The above-mentioned components of the propulsion system of the bus 1, including the energy storage system 7, are connected to a vehicle control unit 8.

Even though the invention is described with reference to a vehicle in the form of a bus, it can be used for virtually any type of vehicle which is operated by means of at least an electric machine and which has an energy storage system comprising a battery pack with a number of battery cells.

During certain modes of operation of the bus 1, it is suitable to use only the electric machine 3 for operating the bus 1. This means that the energy storage system 7 will deliver the required power to the electric machine 3, which in turn is driving the rear axle 6. During other modes of operation of the bus 1, for example when the state of charge of the energy storage system 7 is determined as not being sufficient for operating the bus 1 by means of the electric machine 3, the internal combustion engine 2 is connected, via the clutch 4 and the gearbox 5, to the rear axle 6. The manner in which an electric machine and an internal combustion engine can be combined and used for operating a vehicle is generally previously known and for this reason, it is not described in any greater detail here.

The bus 1 is furthermore equipped with a first electric connector element 9, suitably in the form of a pantograph, which is mounted on the roof of the bus 1, and which is arranged for being connected to a second electric connector element 10 in the form of an overhead electrical conductor wire which is configured for conducting a charging current having a certain voltage. In this manner, the energy storage system 7 can be supplied with an electrical current, by means of the connection between the overhead wire 10 and the pantograph 9, in order to charge the battery pack 7a.

According, to the embodiment, the pantograph 9 and the overhead wire 10 are arranged so that charging of the energy storage system 7 takes place while the bus 1 is standing still, i.e. either at a charging station at a bus terminal or at a bus stop or a similar position. The overhead wire 10 forms part of an external power supply 11, as indicated in a schematic manner in FIG. 1, which is configured for feeding a certain charging current with a charging voltage to the wire 10.

A process for charging the energy storage system 7 is initiated when the bus approaches the overhead wire 10 so that the pantograph 9 and the wire 10 can come into contact with each other. This means that charging of the electrical storage system 7 is initiated upon connection of the electrical storage system 7 to the external power supply 11 via the first connector element 9 and the second connector element 10.

An embodiment of the invention will now be described in greater detail with reference to FIG. 2, which is a simplified schedule of the batter pack 7a and associated components of the vehicle 1. All components shown in FIG. 1 are not shown in FIG. 2.

As explained above, the battery pack 7a comprises a number of battery cells C1, C2, C3 . . . etc. (also referred to with reference numeral "C") which according to an embodiment is suitably in the magnitude of 200 cells, although the specific number may vary. According to an embodiment, the battery cells are of the lithium ion type, although the principles of the invention are equally applicable to other types of battery cells.

Figure 2:
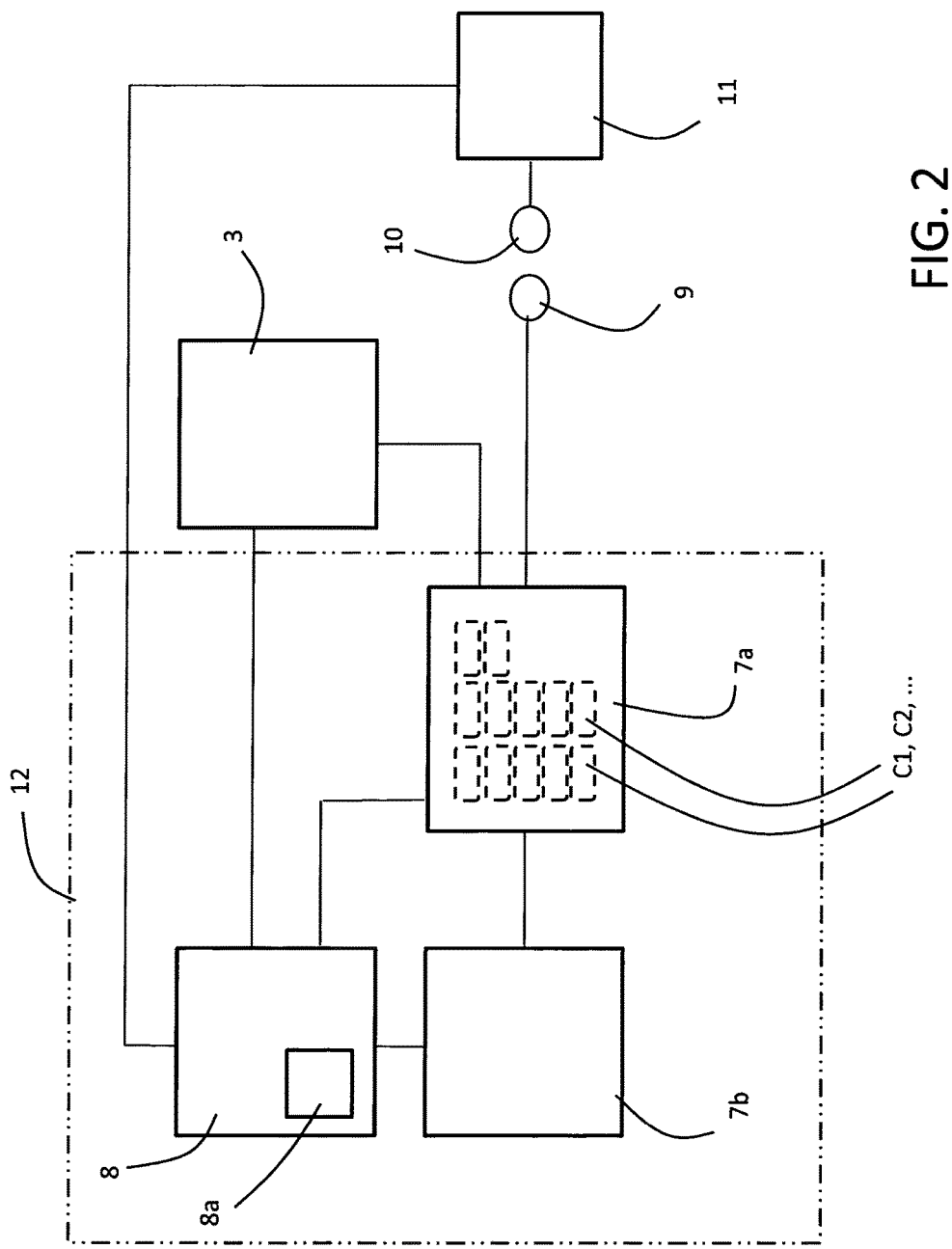
FIG. 2 is a schematic view of a battery management system for a vehicle, in accordance with the principles of the invention.

As indicated in FIG. 2, the battery pack 7a is connected to the electric machine 3 and is configured for operating said electric machine 3 (which in turn operates the vehicle 1). Furthermore, the battery pack 7a is connected to a sensor unit 7b, which in turn is connected to the control unit 8. As mentioned above, the invention is configured for monitoring the status of the battery pack 7a, i.e. to monitor the status of the battery cells C. For this reason, and according to an embodiment, the sensor unit 7b is configured for measuring the voltage (V) of each battery cell and for transmitting information related to measured voltage values to the control unit 8.

FIG. 2 also shows in a schematic manner the first connector 9, forming part of the vehicle, and the second connector 10, forming part of the external power supply 11. Consequently, the battery pack 7a, the sensor unit 7b and the control unit 8 can be said to constitute a battery management system 12 which is arranged for monitoring the status of the battery cells C1, C2 etc. More precisely, there are three main objectives of the battery management system 12; firstly, to provide an internal state estimation of parameters such as the state of charge SOC), the state of power, the state of health etc. of the battery pack 7a; secondly, to provide a cell balancing procedure (which requires measurements of the state of charge and voltage of all battery cells); and thirdly, to provide fault handling in case conditions such as overcharging or over-heating has been detected.

The status of the battery pack 7a and its battery cells C can be described with parameters such as its state of charge (SOC) and state of health (SOH). The state of charge (SOC) corresponds to the remaining amount of charge in the battery pack 7a and is for this reason estimated continuously. The stage of health (SOH) can be estimated by measuring the cell capacity (Ah) of each battery cell C and also by measuring the ohmic resistance (ohms) of each battery cell C.

An important purpose of the battery management system 12 is to ensure safe and efficient operating conditions for the battery pack 7a and for the entire vehicle 1. In particular, it is necessary to monitor important parameter related to the status of the battery pack 7a, such as the state of charge (SOH) of the battery pack 7a and the state of health (SOH) of the battery pack 7a and its battery cells C.

Furthermore, the control unit 8 is configured for detecting faults related to the operation of the battery pack by means of the voltage measurements. i.e. in the event that the result of the measurement deviates from an expected value or interval of values. For example, a fault could be the result of a premature ageing of a battery cell. In the context of this invention, a fault should be understood to be a deviation of a least one parameter which is related to the battery pack 7a from an acceptable condition.

According to alternative embodiments, the battery management system 12 according to the invention may be configured for measuring other parameters which are indicators of the state of operation of the battery pack 7a. Purely as examples, such parameters can be the battery current (I) or the battery temperature (T). Both these parameters can be used for controlling the status of the battery pack 7a.

Figure 3:
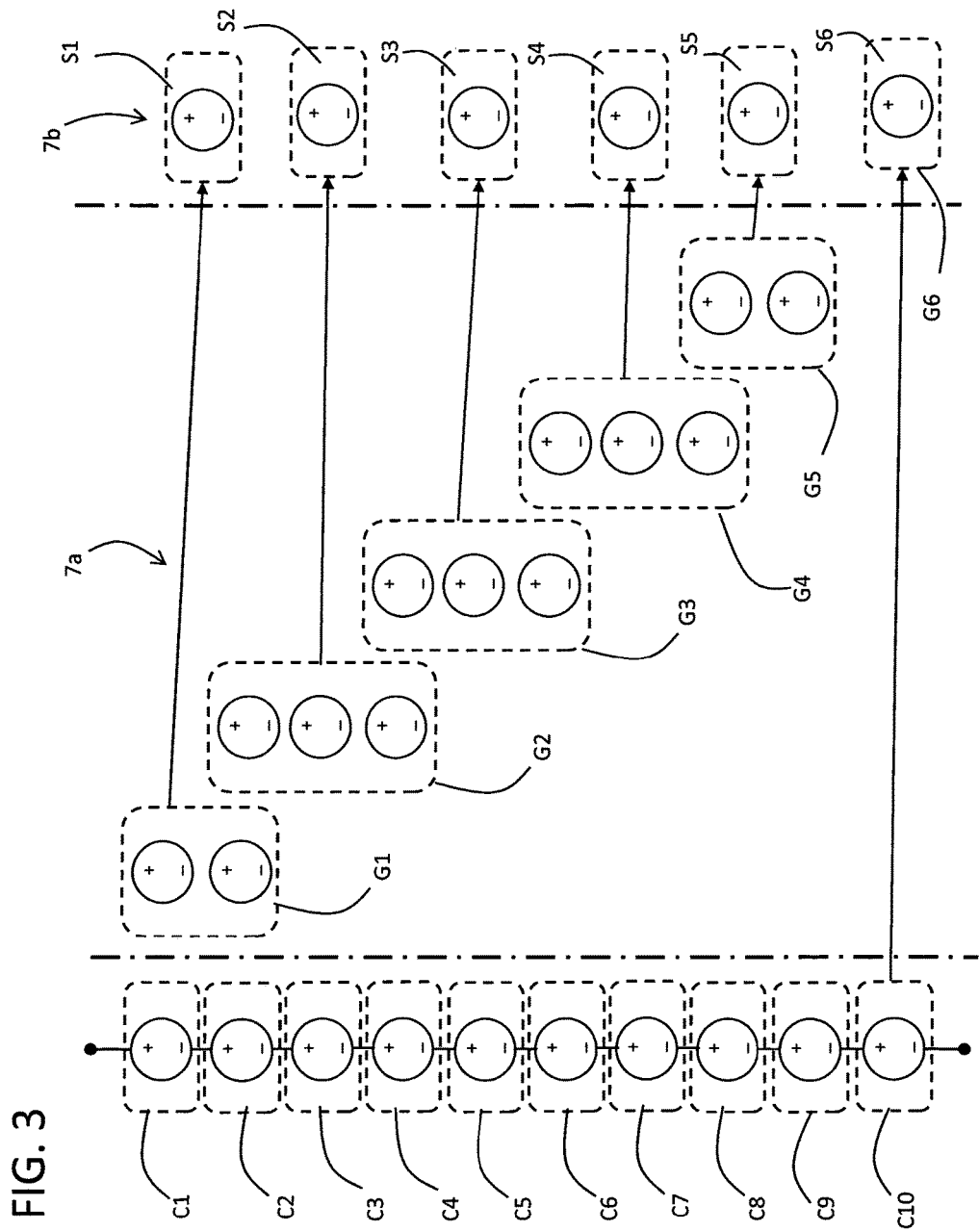
FIG. 3 is a schematic view of a battery pack according to an embodiment of the invention.

With reference to FIG. 3, there is shown a number of battery cells C1, C2, C3, . . . C10 (i.e. C1-C10) which are arranged in series, i.e. so that they together form a unit having a voltage which is constituted by the sum of each individual voltage of each battery cell C1-C10. The example shown in FIG. 3 comprises ten individual battery cells C1-C10, but the invention can be implemented with generally any number of battery cells arranged in a batter pack.

As described above, there is a desire to arrange the sensor unit 7b (see also FIGS. 1 and 2) so as to provide a measurement of at least one parameter which reflects the state of operation of the battery pack 7a by means of said sensor unit 7b. According to an embodiment, there is provided a measurement of the voltage (V) of each battery cell C1-C10 by means of said sensor unit 7b. The measured voltage values are then used for determining important properties of the battery pack such as the state of charge, cell capacity and cell temperature. This will be described in greater detail below.

In order to provide measurements, the sensor unit 7b comprises a number of voltage sensors S1, S2, . . . , S6 (also referred to as "S1-S6"). According to known technology, a sensor unit may comprise a voltage sensor for each battery cell in a battery pack. However, according to an embodiment of the invention, it uses a hierarchical model in order to reduce the number of necessary voltage sensors and in order to minimize the complexity of computations in the control unit. In this manner, the cost-efficiency of the complete sensor unit and control unit can be increased.

In order to obtain this, the embodiment shown in FIG. 3 is configured so that the battery pack 1 is arranged in a manner so that the battery cells C1-C10 are arranged in a plurality of groups of battery cells. This is indicated with reference numerals G1, G2 . . . , G6 in FIG. 3. It should be noted that both those groups which contain two or more battery cells (such as the group G1, containing two battery cells C1, C2) and those groups which contain only one single battery cell (such as the group G6, which contains only the battery cell (C10) are referred to as "groups" in the context of this invention.

As indicated in FIG. 3, each of these groups of cells G1-G6 are connected to the sensor unit 7b, in particular so that:

a first group G1 is connected to a first sensor S1;
a second group G2 is connected to a second sensor S2;
a third group G3 is connected to a third sensor S3;
a fourth group G4 is connected to a fourth sensor S4;
a fifth group G5 is connected to a fifth sensor S5; and
a sixth group G6 is connected to a sixth sensor S6.

The invention is based on a hierarchical model which is decomposed into a collection of sub-systems. A number of sensors S1-S6 which is less than the number of battery cells C1-C10 is provided, which leads to a concept which is more cost-efficient that previously known solutions. This concept will now be described with reference to an example; if the first sensor S1—which is associated with the first group G1—does not indicate any error (for example in the form of a detected voltage level which is lower than a certain threshold level) and if the second sensor S2 indicates that there is an error, it can be assumed that either the third battery cell C3 or the fourth battery cell C4 is faulty. If the third sensor S3 (which is associated with the third group G3) does not indicate any error, it can ultimately be assumed that it is the third battery cell C3 which is the faulty one.

Similar processes for determining where any detected error originates from can be deduced for all the battery cells C1-C10. Any faulty cell could be recognized by the sensor unit 7b. Consequently, and according to the embodiment shown in FIG. 3, the measurements related to all ten battery cells C1-C10 are registered by using no more than six voltage sensors S1-S6. This means that the cost of the sensor unit 7b can be decreased while the possibilities for detecting various parameters of the battery cells C1-C10 can be maintained. In this example, the computational load has been decreased 40% since the number of sensor units has decreased by 40%.

In order to accomplish this, the embodiment shown in FIG. 3 is arranged so that the groups of cells G1-G6 are configured so that at least two of the groups G1-G6 comprise two or more cells, and also so that at least two of the groups G1-G6 overlap so that a battery cell (for example battery cell C2 in FIG. 3) forms part of the overlapping groups. Also, the sensor unit 7b is connected to the groups G1-G6 in a manner so that each of the groups G1-G6 is connected to a corresponding sensor S1-S6 which forms part of the sensor unit 7b. The sensor unit 7b is arranged so that there is one estimation of a measured value per group. Finally, the number of groups G1-G6 is less than the number of cells C1-C10.

According to an aspect, the groups G1-G6 of battery cells C1-C10 are arranged in a manner so that it fulfils the following relationship:

number of groups−number of cells/2≥1

This corresponds to the embodiment shown in FIG. 3, which shows ten battery cells C1-C10 and six groups G1-G6. This set-up consequently fulfils the relationship above.

As mentioned, the sensors S1-S6 are configured for measuring at least one parameter related to the state of operation of the battery cells C1-C10. According to an embodiment, the terminal voltage (V) of the battery cells C1-C10 is used as the relevant sensor signal. The measured voltage values can be used in the control unit 8 for estimating a certain property of the battery cells C1-C10 or groups of cells G1-G6. According to an embodiment, the control unit 8 is arranged for estimating the state of charge. According to alternative embodiments, other properties such as the cell capacity for each battery cell C1-C10 and the resistance of each battery cell can be determined.

The principles for estimating properties such as the state of charge, the cell capacity will not be described in detail, but may suitably be implemented by means of the battery management system 12. In particular, the battery management system 12 is configured for receiving measurement values from the sensor unit 7b related to at least the battery terminal voltage (V) in order to calculate values relating to the state of charge, the cell capacity and the ohmic resistance of each battery.

Also, the embodiment is suitably arranged so that the control unit 8 (see FIG. 2) may generate an indication of a fault in the event that the result of the measurement of any of the above-mentioned parameters (battery terminal voltage (V), battery current (I) and battery temperature (T)) deviates from an expected value. This is suitably carried out using the principles shown in FIG. 3, i.e. with the battery cells C1-C10 arranged in groups G1-G6 as explained, and with sensors S1-S6 being associated with the groups G1-G6. In the event that the measurements from the sensors S1-S6 should indicate that any of the battery cells (C1-C10) is defective, the battery management system 12 issues an indication or a warning signal.

It is to be understood that the present invention is not limited to the embodiments described above and illustrated in the drawings; rather, the skilled person will recognize that many changes and modifications may be made within the scope of the appended claims. For example, although the terminal voltage (V) is normally used as a relevant sensor signal (see FIG. 3), other parameters may also be measured by means of the sensor unit, such as the temperature (T) of the battery cells C1-C10 or the battery current (I). Further, the present invention can be implemented in any vehicle, full electric or hybrid electric, comprising an energy storage system similar to the ones described in the exemplified embodiments.

The invention claimed is:

1. A method for monitoring the status of a plurality of connected battery cells in a battery pack, the method comprising: —arranging the battery cells in at least two groups of cells: —connecting each one of the groups of cells to a corresponding sensor forming part of a sensor unit: and—providing a measurement of at least one parameter indicative of the state of operation of the battery pack by means of the sensor unit; —arranging the groups of cells in a manner so that: —at least two of the groups comprise two or more cells, and—at least two of the groups overlap so that a cell forms part of the overlapping groups; and—connecting each sensor of the sensor unit to each one of the corresponding groups for estimating a measurement of the parameter for each one of the groups: and wherein—the number of groups is less than the number of cells.

2. A method according to claim 1, comprising: —arranging the groups of cells in a manner so that it fulfills the relationship: number of groups−number of cells/2≥1.

3. A method according to claim 1 comprising: —using the sensors for measuring at least one parameter related to the state of operation of the battery cells, the parameter being at least one of the following: the battery current (I): the terminal voltage (V) of at least one cell; and the temperature (T) of at least one cell.

4. A method according to claim 3, comprising: —estimating, based on the measured parameter, at least one of the following properties of each battery cell or groups of cells: —the state of charge: —the cell capacity; and—the resistance.

5. A method according to claim 1, comprising: —generating an indication of a fault in the event that the result of the measurement deviates from an expected value.

6. A battery management system for monitoring the status of a plurality of connected battery cells in a battery pack, comprising: —a plurality of battery cells which are arranged in at least two groups of cells; —a sensor unit connected to the groups so that each one of the groups is connected to a corresponding sensor forming part of the sensor unit; the sensor unit being configured for providing a measurement of at least one, parameter indicative of the state of operation of the battery pack: and—a control unit connected to the sensor unit; —an arrangement of the groups of cells wherein: —at least two of the groups comprise two or more cells, and—at least two of the groups overlap so that a cell forms part of the overlapping groups; and—a connection between the each sensor of the sensor unit and each one of the corresponding groups for estimating a measurement of the parameter for each one of the groups: wherein—the number of groups is less than the number of cells.

7. A system according to claim 6, the sensors are configured for measuring at least one parameter related to the state of operation of the battery cells, the parameter being at least one of the following: the battery current (I); the terminal voltage (V) of at least one cell; and the temperature (T) of at least one cell.

8. A system according to claim 6, the control unit is configured for generating an indication of a fault in the event that the result of the measurement deviates from an expected value.

9. A vehicle comprising a battery management system according to claim 6.

10. A computer comprising a program for performing the method steps of claim 1 when the program is run on the computer.

11. A non-transitory computer readable medium carrying a computer program for performing the steps of claim 1 when the program product is run on a computer.

12. A control unit for monitoring the status of a plurality of connected battery cells in a battery pack, the control unit being configured to perform the steps of the method according to claim 1.

* * * * *